(12) United States Patent
Safranski et al.

(10) Patent No.: US 11,823,723 B2
(45) Date of Patent: Nov. 21, 2023

(54) MEMORY DEVICE WITH SPIN-HARVESTING STRUCTURE

(71) Applicant: International Business Machines Corporation, Armonk, NY (US)

(72) Inventors: Christopher Safranski, Yorktown Heights, NY (US); Jonathan Zanhong Sun, Shrub Oak, NY (US)

(73) Assignee: International Business Machines Corporation, Armonk, NY (US)

( * ) Notice: Subject to any disclaimer, the term of this patent is extended or adjusted under 35 U.S.C. 154(b) by 177 days.

(21) Appl. No.: 17/456,088

(22) Filed: Nov. 22, 2021

(65) Prior Publication Data

US 2023/0162773 A1    May 25, 2023

(51) Int. Cl.
*G11C 11/16*    (2006.01)
*H10B 61/00*    (2023.01)
(Continued)

(52) U.S. Cl.
CPC ............ *G11C 11/161* (2013.01); *H10B 61/00* (2023.02); *H10N 50/01* (2023.02); *H10N 50/10* (2023.02); *H10N 50/80* (2023.02); *H10N 50/85* (2023.02)

(58) Field of Classification Search
CPC ... G11C 11/161; G11C 11/1675; G11C 11/18; H10B 61/00; H10N 50/01; H10N 50/10; H10N 50/80; H10N 50/85
(Continued)

(56) References Cited

U.S. PATENT DOCUMENTS 8,889,433 B2    11/2014 De Brosse et al.
9,460,768 B2    10/2016 Manipatruni et al.
(Continued)

FOREIGN PATENT DOCUMENTS

EP    2447949 A1 *  5/2012    ............ G11C 11/16
TW    202036944 A    10/2020
(Continued)

OTHER PUBLICATIONS

Kim, Yusung, Design of nonvolatile on-chip memory using spin torque devices, 2015, Purdue University, All pages. (Year: 2015).*
(Continued)

*Primary Examiner* — Michael T Tran
(74) *Attorney, Agent, or Firm* — Joseph C. Drish; Harrington & Smith (57) ABSTRACT

A memory device includes a first terminal and a second terminal; a magnetic tunnel junction coupled to the second terminal; wherein the magnetic tunnel junction comprises a magnetic free layer, and the magnetic tunnel junction is configured to be displaced by a plurality of distances from a center position of the device; a nonmagnetic metallic spin harvesting conductor coupled to the magnetic tunnel junction; wherein the nonmagnetic metallic spin harvesting conductor has a lateral dimension that is larger than that of the magnetic tunnel junction; an electrically insulating spin conductor coupled to the nonmagnetic metallic spin harvesting conductor; wherein the electrically insulating spin conductor has relatively less electrical conductivity than the nonmagnetic metallic spin harvesting conductor; wherein the nonmagnetic metallic spin harvesting conductor collects spin current from the electrically insulating spin conductor; and a spin orbit conduction channel coupled to the electrically insulating spin conductor and to the first terminal.

20 Claims, 10 Drawing Sheets

(51) Int. Cl.
  *H10N 50/80* (2023.01)
  *H10N 50/01* (2023.01)
  *H10N 50/85* (2023.01)
  *H10N 50/10* (2023.01)
(58) Field of Classification Search
  USPC .................................................. 365/158, 173
  See application file for complete search history.

(56) References Cited

U.S. PATENT DOCUMENTS

| | | | |
|---|---|---|---|
| 10,134,457 B1 | 11/2018 | Mihajlovic et al. | |
| 10,211,393 B2 | 2/2019 | Mihajlovic et al. | |
| 10,381,339 B1* | 8/2019 | Wang | G11C 29/006 |
| 10,381,552 B2 | 8/2019 | Mihajlovic et al. | |
| 10,529,775 B2 | 1/2020 | Wang et al. | |
| 11,075,334 B2 | 7/2021 | Reznicek et al. | |
| 2011/0049655 A1 | 3/2011 | Assefa et al. | |
| 2015/0335767 A1* | 11/2015 | Yung | C12N 5/0623 |
| | | | 424/9.32 |
| 2018/0182954 A1 | 6/2018 | Sayed et al. | |
| 2019/0265317 A1* | 8/2019 | Ortiz | H02J 50/10 |
| 2020/0006637 A1 | 1/2020 | Gosavi et al. | |
| 2021/0082998 A1 | 3/2021 | Lee et al. | |
| 2021/0151665 A1 | 5/2021 | Komura et al. | |
| 2022/0010203 A1* | 1/2022 | Stubbs | C09K 11/02 |
| 2022/0209102 A1* | 6/2022 | Law | H01F 10/3286 |

FOREIGN PATENT DOCUMENTS

| | | |
|---|---|---|
| TW | 202109927 A | 3/2021 |
| WO | 2015102739 A2 | 7/2015 |

OTHER PUBLICATIONS

J.Z. Sun "A Three-Terminal Spin-Torque-Driven Magnetic Switch" Applied Physics Letter 95 [accepted Jul. 17, 2009; published online Aug. 28, 2009].

Noriyuki Sato et al. "Two-Terminal Spin-Orbit Torque Magnetoresistive Random Access Memory" Nature Electronics vol. 1. Sep. 2018.

Shehrin Sayed et al. "Spin Funneling for Enhanced Spin Injection into Ferromagnets" Scientific Report [accepted Jun. 6, 2016; Jul. 4, 2016].

* cited by examiner

MEMORY DEVICE WITH SPIN-HARVESTING STRUCTURE

BACKGROUND

The exemplary embodiments described herein relate generally to memory device design, more specifically, to a memory device with a spin-harvesting structure.

BRIEF SUMMARY

In one aspect, a memory device includes a first electrical terminal and a second electrical terminal; a magnetic tunnel junction coupled to the second electrical terminal; wherein the magnetic tunnel junction comprises a magnetic free layer, and the magnetic tunnel junction is configured to be displaced by a plurality of distances from a center position of the memory device; a nonmagnetic metallic spin harvesting conductor coupled to the magnetic tunnel junction; wherein the nonmagnetic metallic spin harvesting conductor has a lateral dimension that is larger than that of the magnetic tunnel junction; an electrically insulating spin conductor coupled to the nonmagnetic metallic spin harvesting conductor; wherein the nonmagnetic metallic spin harvesting conductor collects spin current from the electrically insulating spin conductor; wherein the electrically insulating spin conductor has relatively less electrical conductivity than the nonmagnetic metallic spin harvesting conductor; and a spin orbit conduction channel coupled to the electrically insulating spin conductor and to the first electrical terminal; wherein the spin orbit conduction channel generates the spin current from a laterally asymmetric charge current flow; wherein the spin current is conducted by the electrically insulating spin conductor to the nonmagnetic metallic spin harvesting conductor and further delivered to the magnetic free layer of the magnetic tunnel junction.

In another aspect, a memory device includes two terminals comprising a first electrical terminal and a second electrical terminal; a magnetic tunnel junction comprising a free layer coupled to the second electrical terminal; a spin and charge conductor whose lateral dimension is larger than that of the magnetic tunnel junction; an electrically insulating spin conductor coupled to the spin and charge conductor; wherein the spin and charge conductor collects spin current from the electrically insulating spin conductor; wherein the electrically insulating spin conductor has relatively less electrical conductivity than the spin and charge conductor; and a spin orbit channel coupled to the electrically insulating spin conductor and to the first electrical terminal; wherein the electrically insulating spin conductor assists the memory device with asymmetric charge current flow; wherein the asymmetric charge current flow is enhanced by the spin and charge conductor.

In another aspect, a method to form a memory device includes coupling a second electrical terminal to a magnetic tunnel junction; wherein the magnetic tunnel junction comprises a magnetic free layer, and the magnetic tunnel junction is configured to be displaced by a plurality of distances from a center position of the memory device; coupling a nonmagnetic metallic spin harvesting conductor to the magnetic tunnel junction; wherein the nonmagnetic metallic spin harvesting conductor has a lateral dimension that is larger than that of the magnetic tunnel junction; coupling an electrically insulating spin conductor to the nonmagnetic metallic spin harvesting conductor; wherein the nonmagnetic metallic spin harvesting conductor collects spin current from the electrically insulating spin conductor; wherein the electrically insulating spin conductor has relatively less electrical conductivity than the nonmagnetic metallic spin harvesting conductor; and coupling a spin orbit conduction channel to the electrically insulating spin conductor and to a first electrical terminal; wherein the spin orbit conduction channel generates the spin current from a laterally asymmetric charge current flow; wherein the spin current is conducted by the electrically insulating spin conductor to the nonmagnetic metallic spin harvesting conductor and further delivered to the magnetic free layer of the magnetic tunnel junction.

BRIEF DESCRIPTION OF THE SEVERAL VIEWS OF THE DRAWINGS

The foregoing and other aspects of exemplary embodiments are made more evident in the following Detailed Description, when read in conjunction with the attached Drawing Figures, wherein.

DETAILED DESCRIPTION

The term "exemplary" is used herein to mean "serving as an example, instance, or illustration." Any embodiment described herein as "exemplary" is not necessarily to be construed as preferred or advantageous over other embodiments. All of the embodiments described in this Detailed Description are exemplary embodiments provided to enable persons skilled in the art to make or use the invention and not to limit the scope of the invention which is defined by the claims.

Described herein is a spin-harvesting structure for a spin-orbit torque (SOT) assisted switch. Further described herein is a method to make use of an SOT-assisted magnetic tunnel junction (MTJ) based spin-transfer-torque (STT) memory element to improve write-characteristics and reduce write current. The method represents an improvement over using an asymmetric electrode to extract a charge-current from an MTJ element to generate an SOT-assisted spin-current to speed up switching and reduce switching current. A drawback of using an asymmetric electrode to extract a charge-current from an MTJ element to generate an SOT-assisted spin-current to speed up switching and reduce switching current, is the lack of ability to separately optimize spin and charge current flow, resulting in reduced SOT assistance.

Accordingly, the method described herein resolves a drawback of the asymmetric electrode approach by using a structure for "spin-harvesting" that both increases the asymmetric charge-current flow's spin-current generation, and the effective collection of spin-current thus generated, so as to achieve the goal of better SOT assistance to MTJ memory switching characteristics.

The methods and structures described herein provide a significant (4× estimated) increase in spin-current magnitude from that of the MTJ's spin-filtering current. In addition, the herein described structure leverages materials and device-physics properties.

Figure 1:
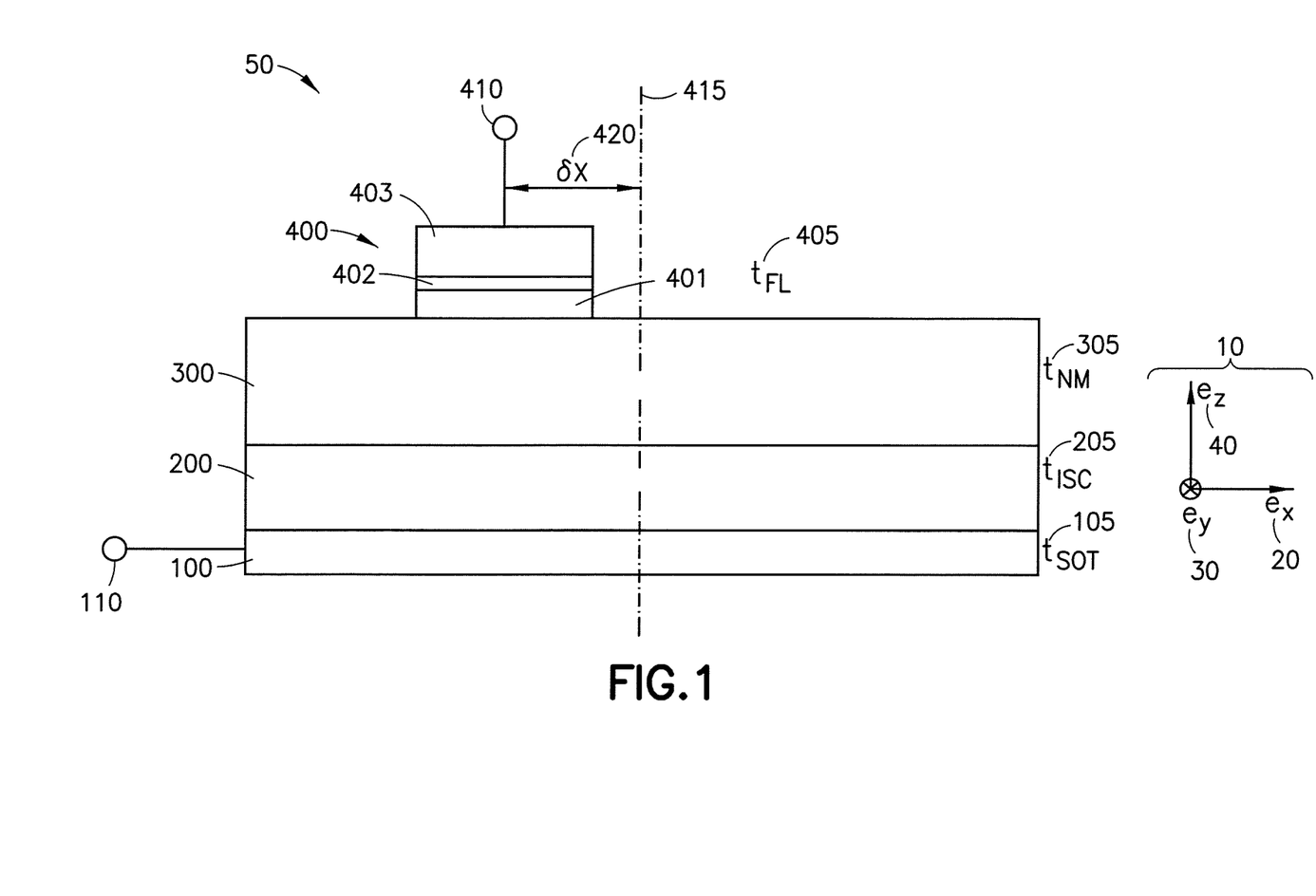
FIG. 1 is a cross-sectional view of a spin-harvesting structure, based on the examples described herein.

FIG. 1 shows the spin-harvesting structure 50 for an SOT-assisted switch, as described herein. The structure 50 includes a spin-orbit-conduction channel 100, otherwise known as a spin-orbit torque (SOT) conductor 100. The structure 50 further includes a first electrical terminal 110 for a two-terminal memory cell. The structure 50 further includes an electrically insulating or leaky insulating spin-conductor (ISC) 200. The spin-conductor 200 may for example comprise nickel oxide (NiO) or iron oxide ($Fe_3O_4$), or other material that conducts charge current at a lower level relative to materials that comprise the spin conductor 300, but has high conductivity for spin current. The structure 50 further includes such a nonmagnetic metallic (NM) spin conductor 300 functioning as a spin-harvesting conductor. The NM spin conductor 300 may comprise a material such as copper (Cu), silver (Ag), gold (Au), and/or silver-tin alloy (AgSn), and other alloys known to have long spin-diffusion length and high spin conductance.

As further shown in FIG. 1, the structure 50 includes a magnetic tunnel junction (MTJ) memory element 400. A magnetic free-layer (FL) 401, a tunnel barrier (TB) 402 and a reference layer (RL) 403 form the MTJ memory element 400. Also shown is a second electrical terminal 410 for the two-terminal memory cell 50, the second electrical terminal 410 being coupled to the MTJ 400 via the RL 403. The MTJ-based memory element 400 can be displaced from the center position 415 of the structure 50 by a σx amount (420) to maximize spin-current collection from the NM spin conductor 300. In an embodiment shown in FIG. 1, the structure 50 is fabricated such that the first electrical terminal (110) is defined by a vertical VIA metal stud through an insulating layer for contacting the edge of SOT channel (100), and at a position where (110) is illustrated. Similarly, a top metallic contact can be made to the top of the metal stud forming the MTJ's second terminal (410), by chemical-mechanical-polish opening of such a metal stud from its conforming deposited insulators, for example, for contacting circuits lithographically defined above the MTJ layer.

The thickness of the free layer 401 is represented by the variable $t_{FL}$ (405), the thickness of the NM spin-conductor 300 is represented by the variable $t_{NM}$ (305), the thickness of the leaky insulating spin-conductor 200 is represented by the variable $t_{ISC}$ (205), and the thickness of the spin-orbit-conduction channel 100 is represented by the variable $t_{SOT}$ (105). The spin-orbit-conduction channel 100 generates a spin-orbit torque (SOT). The device structure 50 is hereafter assumed to be situated in an orthonormal coordinate system having the three base unit vectors as $e_x$ (20), $e_y$ (30), and $e_z$ (40), as illustrated by (10).

Figure 2:
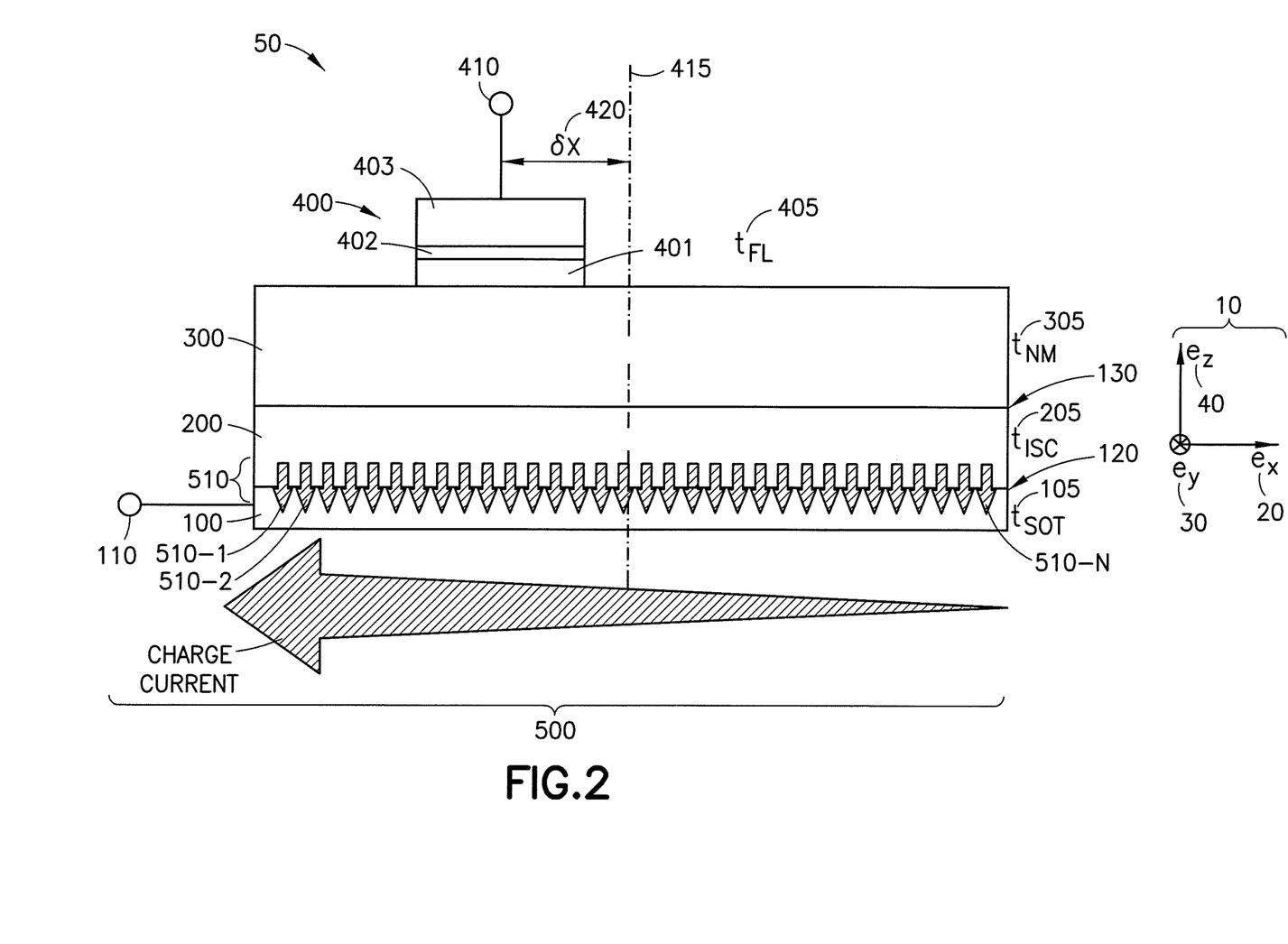
FIG. 2 is another cross-sectional view of the spin-harvesting structure, showing a charge current conducted by the spin-harvesting structure.

With reference to FIG. 2, the electrically leaky spin-conductor 200 conducts spin-current from the SOT channel 100 to spin harvesting metal (i.e. spin-harvesting conductor 300). By making the spin-conductor 200 a "leaky" charge current conductor (as opposed to being perfectly insulating) through materials engineering, the leaky spin-conductor 200 can re-distribute the charge current from the MTJ memory element 400 to the SOT channel conductor 100, creating a laterally asymmetric current flow 500 increasing in intensity in the −x direction. The increasing intensity of the laterally asymmetric current flow 500 is shown by the arrow in FIG. 2 becoming thicker from right to left, symbolizing larger net current at positions closer to the first electrical terminal (110). This charge current 500 generates a corresponding spin-current at the interface 120 between the spin-orbit-conduction channel 100 and the leaky spin-conductor 200 (e.g. the (100)-(200) interface), which is then conducted through the spin-conductor 200 into the NM spin conductor 300 and subsequently to the FL 401 of the MTJ memory element 400.

Accordingly, FIG. 2 illustrates the process of the SOT conductor channel 100 collecting charge current from the insulating spin conductor (ISC) 200, forming a lateral current flow whose intensity increases towards terminal 110. This physical process can be modeled using a numerical simulation.

The charge-current 510 arriving at the interface 120 is shown as having components 510-1, 510-2, up to 510-N, where N is an integer. These arrows (510-1, 510-2, up to 510-N) are to illustrate the substantially uniform current density for charge-current to flow across the interface 120. This charge current 510 is accumulated along the SOT channel (100), forming the charge current flow (500) that increases in intensity towards the terminal (110). The charge-current (510) is the same current as the charge current flow (500), and therefore as shown in FIG. 2, the arrows representing both the charge-current 510 and the charge current flow (500) are presented with the same cross-hatching (this could also be done with representing the charge-current (510) and the current flow (500) by the same color). The spin-current travels upwards from (100) to (200) to (300). The local spin-current density at the interfaces (120) and (130) are substantially proportional to the lateral charge current density inside of SOT channel (100).

The NM element 300 is called a spin-harvesting conductor because the NM element 300 collects spin-current from the entire interface 130 the NM element 300 shares with the leaky spin-conductor 200, and conducts the spin-current thus collected to the FL 401, thus "harvesting" spin-current from an area much larger than that of the FL 401 alone.

The structure 50 is designed with the expectation of a large lateral current flow 500 that is left-right asymmetric. The spin harvesting layer 300 would be able to pick up more SOT spin current since the spin harvesting layer 300 occupies the entire length of the structure 50, larger than the footprint of the FL 401. This design improves upon the more conventional SOT-assisted memory cell where the FL of the MTJ 400 resides directly on the SOT channel (100), or on top of spin-conductor (200), gaining an area ratio approaching $$\frac{Lw_c}{l_{FL}w_{FL}}$$

in this case, or limited by the "spin-diffusion length" $\lambda_{sd}$ in the NM element 300, a spin-memory length, beyond which the harvesting action in the NM element 300 is progressively less effective. A transport-equation based numerical study quantifies these statements, as shown in FIG. 4A, FIG. 4B, FIG. 4C, FIG. 5A, FIG. 5B, and FIG. 5C.

As shown in FIG. 2 and similarly in FIG. 1, the SOT conductor 100 is connected to the ISC 200, and the ISC 200 is connected to the NM conductor 300. That the elements are connected to each other such as at the ISC/SOT interface 120 and the NM/ISC interface 130 and so forth may in some examples mean that the elements (100, 200, 300) or their respective interfaces (120, 130) can contain a minute doping material (e.g. at the interfaces 120, 130) for promoting material properties, electrical properties, and/or spin properties. In some examples, the SOT conductor 100 is directly connected to the ISC 200. In some examples, the ISC 200 is directly connected to the NM conductor 300.

Figure 3:
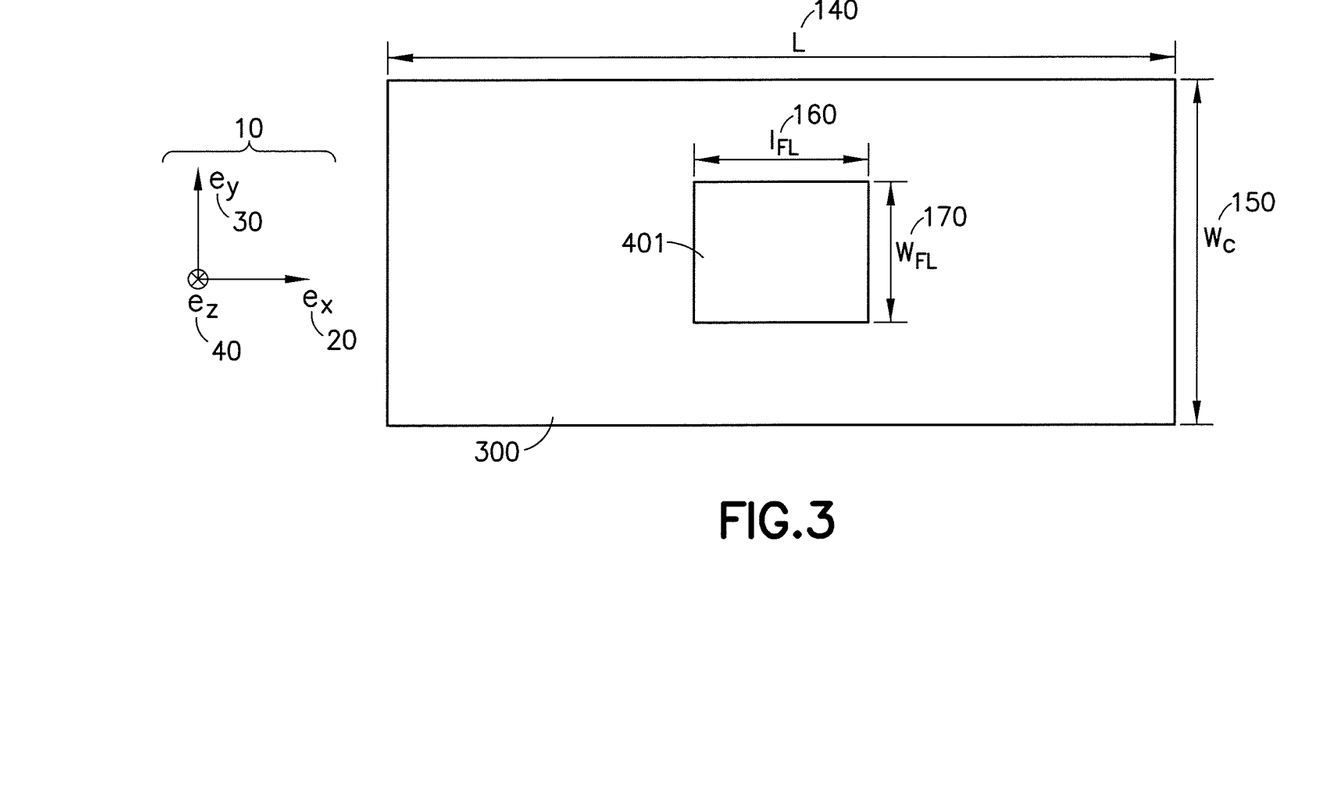
FIG. 3 is a top view of an example spin-harvesting structure.

FIG. 3 is a top view of a simplified version of the device structure 50, including only the FL (which FL may be thought of as the MTJ pillar 400 shown in FIG. 1 and FIG. 2), with dimensions $l_{FL}$ and $w_{FL}$ 170 whereas the spin-harvesting NM layer 300 has the dimension of L 140 and $w_c$ 150. The numbers are for illustrations used in the numerical model.

With reference to FIG. 3 and as indicated, the area ratio gained is $$\frac{Lw_c}{l_{FL}w_{FL}},$$

where L is item 140 (the length of the structure 50 as well as the length of each of conductors 200 and 300), $w_c$ is item 150 (or the width of the structure 50, the width of conductor 200, and the width of conductor 300), $l_{FL}$ is the length 160 of FL 401, and $w_{FL}$ is the width 170 of FL 401.

Accordingly, described herein (including in FIG. 1, FIG. 2, FIG. 3, FIG. 4, FIG. 5, and throughout herein), is a two-terminal magnetic tunnel junction-based memory element 50, assisted by an additional spin-orbit channel 100 with asymmetric charge-current flow, where the charge-current flow asymmetry is enhanced by a spin and charge conductor 300 (such as Ag, Au, Cu, V, etc.), whose lateral dimension is larger than that of a free-layer ferromagnetic memory element 401 of the magnetic tunnel junction 400.

The spin-orbit channel 100 is connected to the spin and charge conductor 300, either directly, or through a spin-conducting poor electrical conductor 200 (such as NiO, YIG, TIG, and other relatively poorer electrical conductors or insulators that conduct spin-current). The electrical conductance of the spin-conducting poor electrical conductor 200 can be tuned by materials optimization to allow a slight reasonable amount of charge current conduction, so the charge current through the free-layer 401 entering vertically from the free-layer FM 401 will laterally spread, and result in an asymmetric charge current flow 500 in the spin-orbit conduction channel 100, to be drawn away towards one side at terminal (110).

Of the combination of the charge and spin conductor 300, spin-conductor 200, and spin-orbit channel 100, the net amount of spin-current coupled into the free layer 401 is augmented compared to having the free-layer metal 401 residing directly on the spin-orbit channel 100. A magnetic tunnel barrier 402 and reference layer 403 may be built on top of the magnetic free-layer 401 to form the said magnetic tunnel junction 400.

Spin-conductance simulation bears out several qualitative arguments. The design begins by starting with the simplest geometry with $\delta x=0$. The positioning of the FL 401 can be optimized subsequently.

FIG. 4A, FIG. 4B, FIG. 4C, FIG. 5A, FIG. 5B, and FIG. 5C show the spin current harvesting performance, where the spin current harvesting performance is measured by the ratio of the harvested spin current ($I_{sHarvested}$) against the spin-current generated from the MTJ 400 ($I_{sMTJ}$) with an assumed MR ratio of 120%, and assuming a symmetric tunnel interface across the tunnel barrier 402.

In particular, the definitions for the quantities plotted in FIG. 4A, FIG. 4B, FIG. 4C, FIG. 5A, FIG. 5B, and FIG. 5C are as follows. The y-axis on the plots shown in FIG. 4A, FIG. 4B, FIG. 4C, FIG. 5A, FIG. 5B, and FIG. 5C is $I_{sHarvested}/I_{sMTJ}$. The quantity $I_{sHarvested}$ is the spin-current harvested from the SOT channel 100 current. The quantity $I_{sMTJ}$ is the spin-current from the MTJ's RL 403 spin-filtering. The quantity $I_{sMTJ}=I_{cg}\eta$, where $I_{cg}$ is the charge current between terminal 110 and terminal 410, $\eta \sim \sqrt{m_r(m_r+2)}/2(m_r+1)$ for symmetric MTJ electrodes across the tunnel barrier 402, and $m_r$ is the tunnel magnetoresistance of the MTJ 400.

In FIG. 4A, FIG. 4B, FIG. 4C, FIG. 5A, FIG. 5B, and FIG. 5C, for clarity L is L (item 140, or the length of the structure 50 as well as the length of each of conductors 200 and 300), wC is $w_c$ (item 150, or the width of the structure 50, the width of conductor 200, and the width of conductor 300), $l_{FL}$ is 4, (the length 160 of FL 401), wFL is $w_{FL}$ (the width 170 of FL 401), and MR is $m_r$ (the tunnel magnetoresistance of the MTJ 400). The abbreviation (n.u.) stands for no units since the plotted quantities are ratios.

Figure 4A:
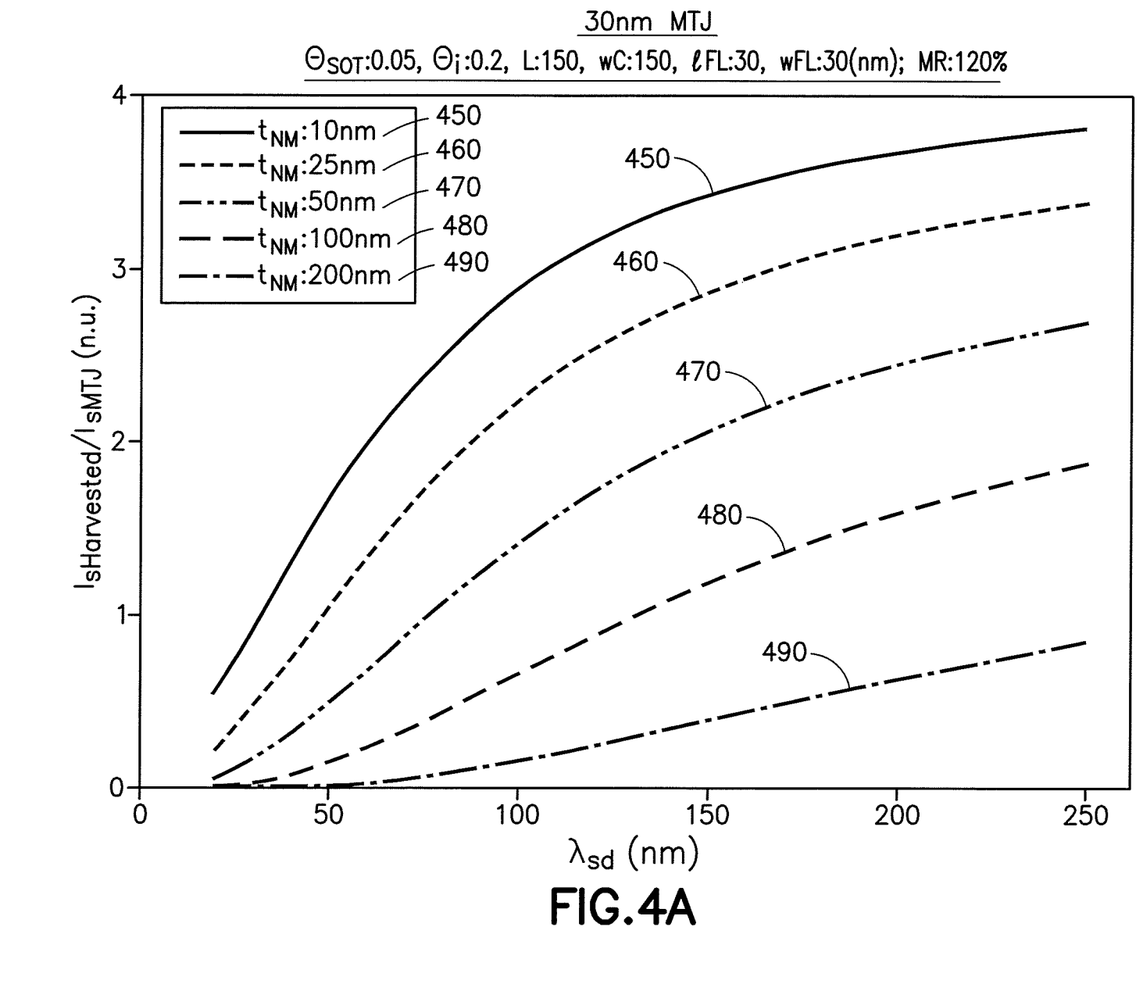
FIG. 4A is a graph showing spin current harvesting performance of the spin-harvesting structure for different nonmagnetic metallic (NM) conductor layer thicknesses, for a 30 nm magnetic tunnel junction (MTJ)
Figure 4B:
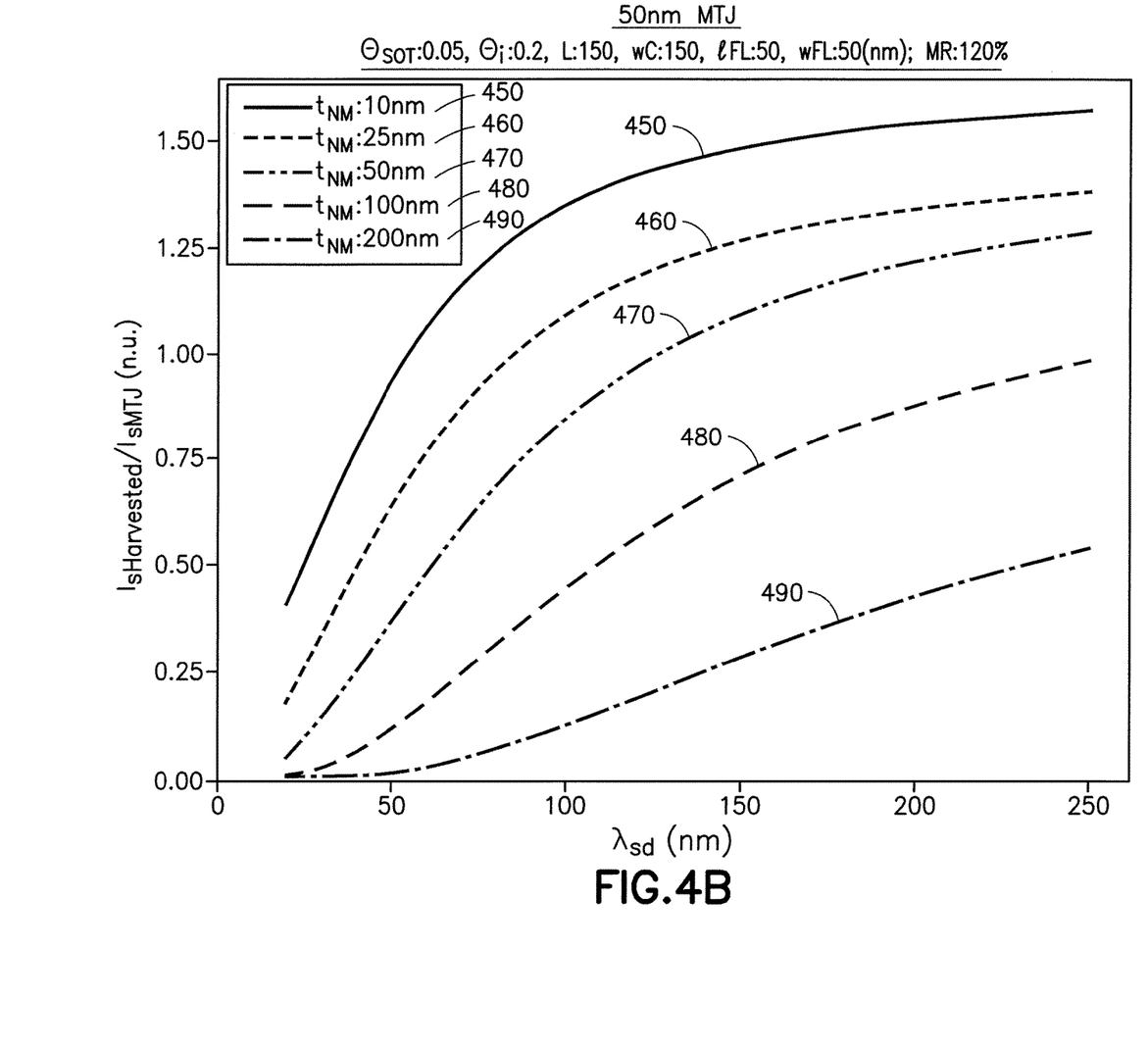
FIG. 4B is a graph showing spin current harvesting performance of the spin-harvesting structure for different NM conductor layer thicknesses, for a 50 nm MTJ.
Figure 4C:
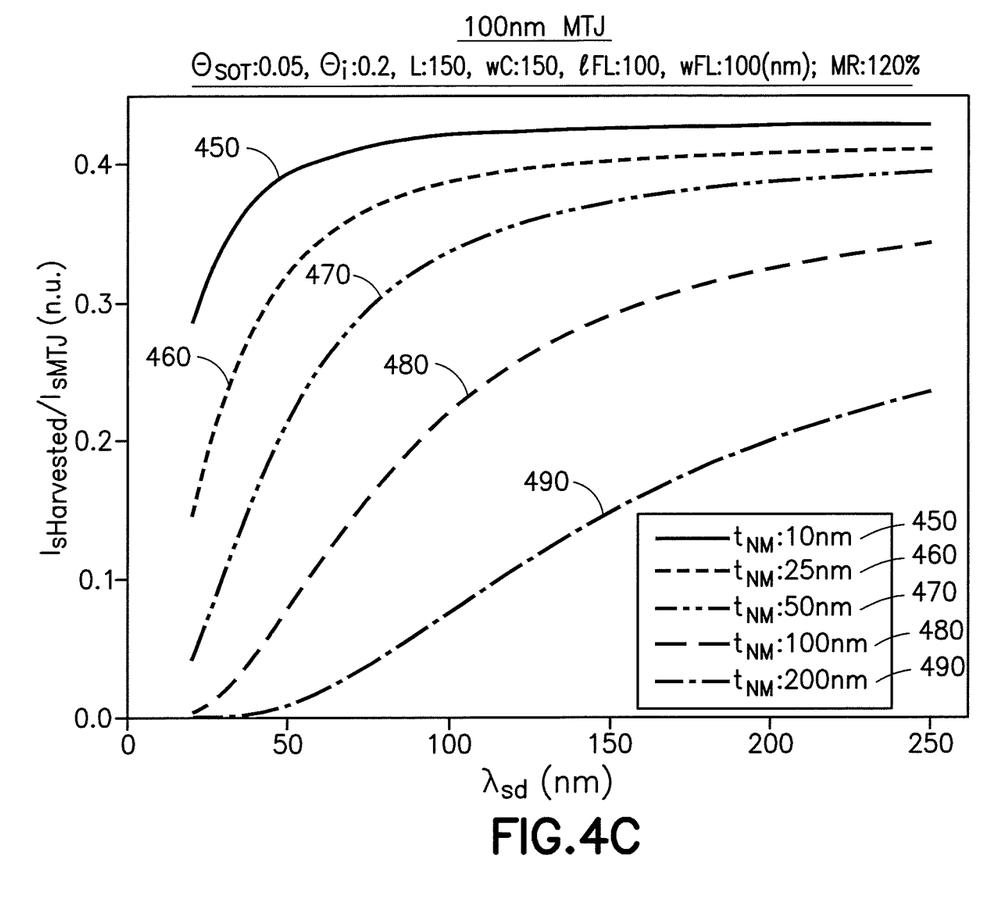
FIG. 4C is a graph showing spin current harvesting performance of the spin-harvesting structure for different NM conductor layer thicknesses, for a 100 nm MTJ.

The results in FIG. 4A, FIG. 4B, and FIG. 4C show the dependence on $\lambda_{sd}$ for different $t_{NM}$, where $\lambda_{sd}$ is the spin-diffusion length. In each of FIG. 4A, FIG. 4B, and FIG. 4C, plot 450 corresponds to $t_{NM}=10$ nm, plot 460 corresponds to $t_{NM}=25$ nm, plot 470 corresponds to $t_{NM}=50$ nm, plot 480 corresponds to $t_{NM}=100$ nm, and plot 490 corresponds to $t_{NM}=200$ nm. For small (30 nm) FLs 401 (e.g. MTJs 400), the gain is sizable (4×) even for a small SOT coefficient of $\Theta_{SOT}=0.05$, and an NiO transmissivity ratio of $\theta_t=0.02$, if the spin-diffusion length $\lambda_{sd}>100$ nm—a value that is realistic for good metal such as Cu and Ag.

$$I_{sMTJ} = I_{cg}\frac{\sqrt{m_r(m_r+2)}}{2(m_r+1)}$$

is assumed to be the tunnel-filtered spin-current corresponding to MR=120% of symmetric electrodes.

Figure 5A:
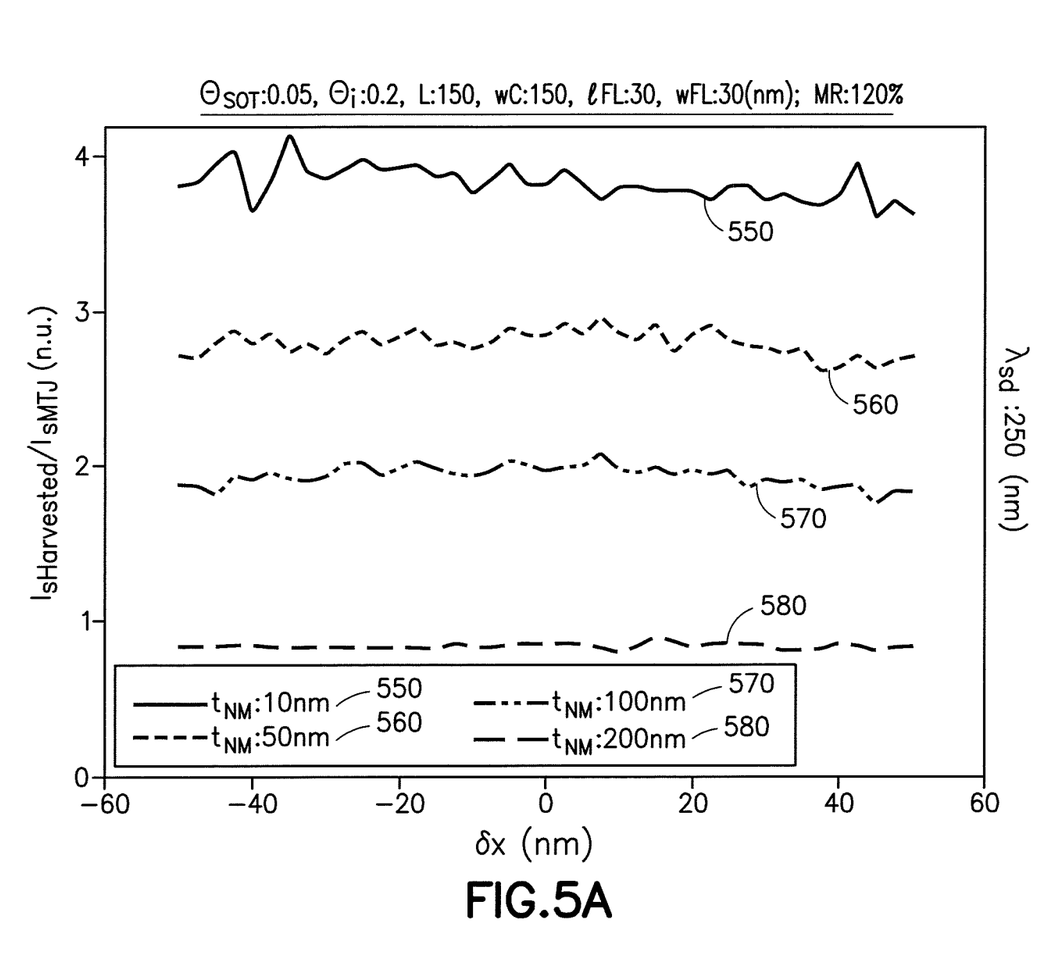
FIG. 5A is a graph showing spin current harvesting performance of the spin-harvesting structure for different NM conductor layer thicknesses and across varying positions ($\delta x$) of the free layer, for a 250 nm spin-diffusion length.
Figure 5B:
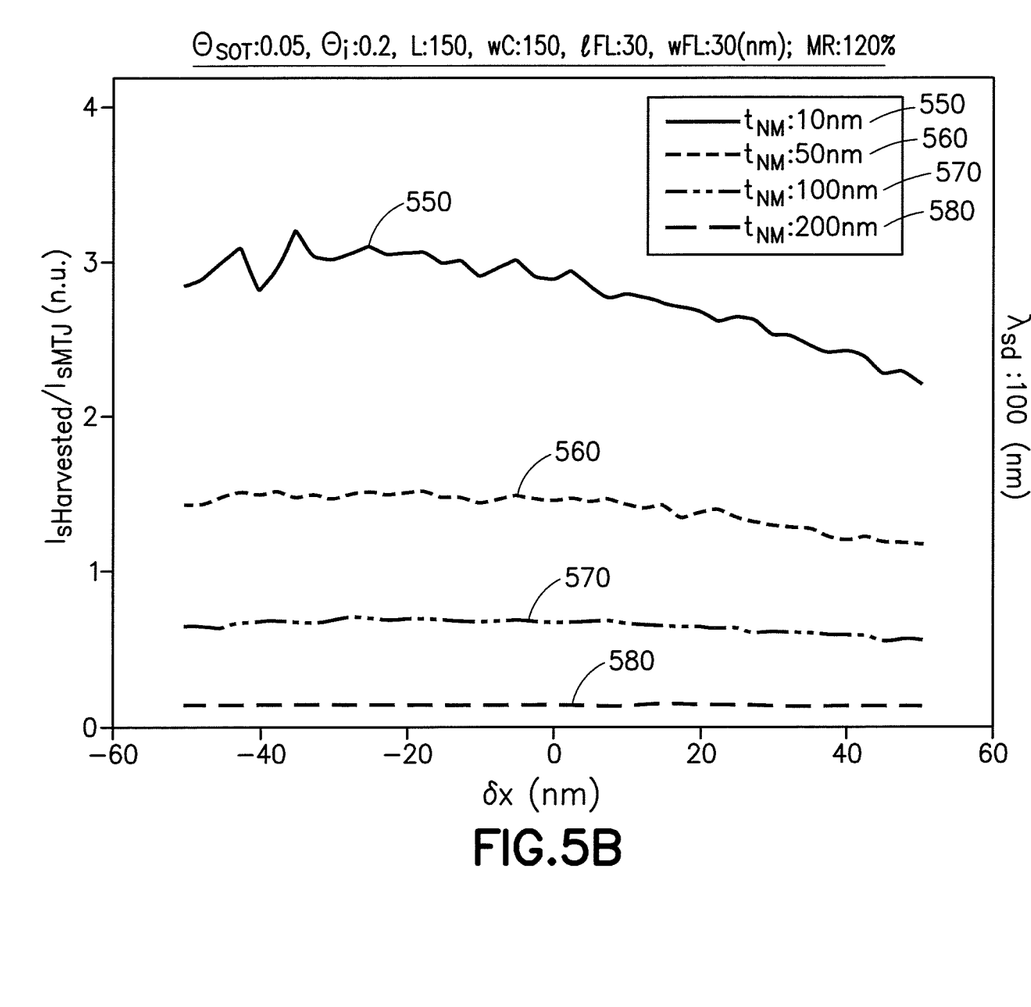
FIG. 5B is a graph showing spin current harvesting performance of the spin-harvesting structure for different NM conductor layer thicknesses and across varying positions ($\delta x$) of the free layer, for a 100 nm spin-diffusion length.
Figure 5C:
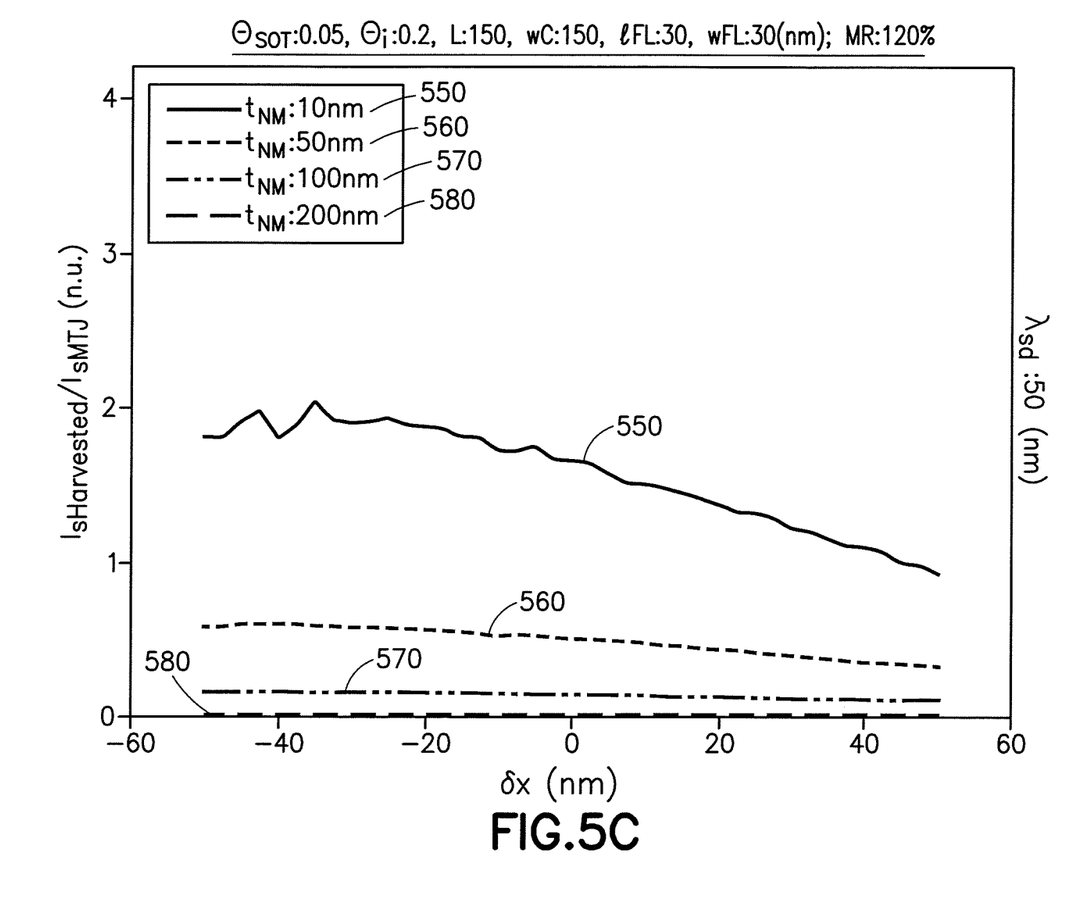
FIG. 5C is a graph showing spin current harvesting performance of the spin-harvesting structure for different NM conductor layer thicknesses and across varying positions ($\delta x$) of the free layer, for a 50 nm spin-diffusion length.

Regarding the role of $\delta x$ 420, the spin-harvest enhancement is augmented on the side of $\delta x$ for the FL 401 to be closer to the charge current 500 downstream direction, i.e. closer to terminal 110. The effect is more significant for shorter $\lambda_{sd}$ and/or thinner NM layer 300 thickness $t_{NM}$ 305.

The exact position δx for best spin-current harvesting can be optimized for a given materials/device design.

In each of FIG. 5A, FIG. 5B, and FIG. 5C, plot 550 corresponds to $t_{NM}=10$ nm, plot 560 corresponds to $t_{NM}=50$ nm, plot 570 corresponds to $t_{NM}=100$ nm, and plot 580 corresponds to $t_{NM}=200$ nm.

Figure 6:
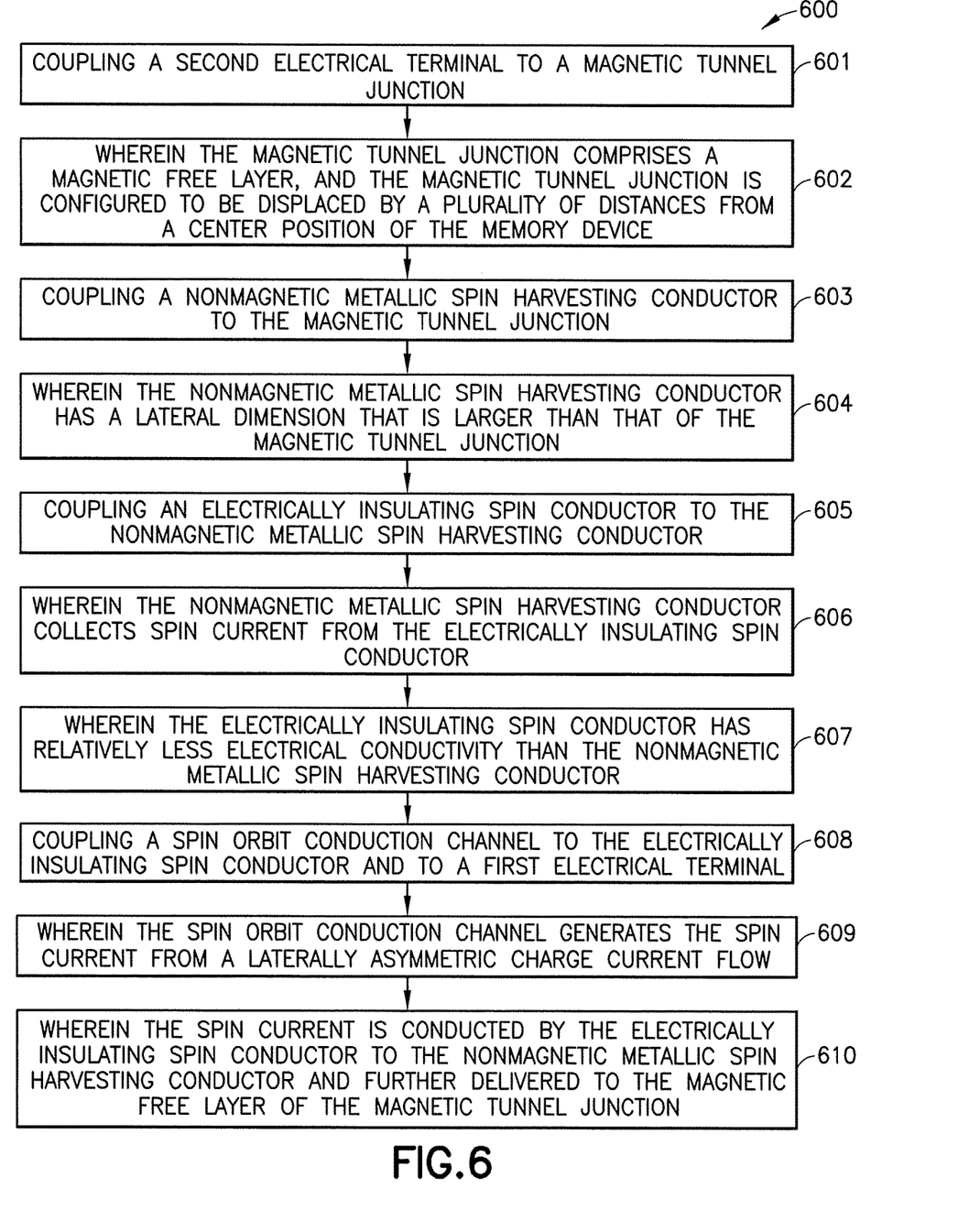
FIG. 6 is a logic flow diagram that illustrates the operation of an exemplary method, in accordance with an exemplary embodiment of the methods for forming the structures described herein.

FIG. 6 is a logic flow diagram that illustrates the operation of an exemplary method 600, based on the embodiments described herein. At 601, the method includes coupling a second electrical terminal to a magnetic tunnel junction. At 602, the method includes wherein the magnetic tunnel junction comprises a magnetic free layer, and the magnetic tunnel junction is configured to be displaced by a plurality of distances from a center position of the memory device. At 603, the method includes coupling a nonmagnetic metallic spin harvesting conductor to the magnetic tunnel junction. At 604, the method includes wherein the nonmagnetic metallic spin harvesting conductor has a lateral dimension that is larger than that of the magnetic tunnel junction. At 605, the method includes coupling an electrically insulating spin conductor to the nonmagnetic metallic spin harvesting conductor. At 606, the method includes wherein the nonmagnetic metallic spin harvesting conductor collects spin current from the electrically insulating spin conductor. At 607, the method includes wherein the electrically insulating spin conductor has relatively less electrical conductivity than the nonmagnetic metallic spin harvesting conductor. At 608, the method includes coupling a spin orbit conduction channel to the electrically insulating spin conductor and to a first electrical terminal. At 609, the method includes wherein the spin orbit conduction channel generates the spin current from a laterally asymmetric charge current flow. At 610, the method includes wherein the spin current is conducted by the electrically insulating spin conductor to the nonmagnetic metallic spin harvesting conductor and further delivered to the magnetic free layer of the magnetic tunnel junction.

The various blocks of method 600 shown in FIG. 6 may be viewed as method steps, and/or as operations that result from operation of computer program code, and/or as a plurality of coupled logic circuit elements constructed to carry out the associated function(s). Method 600 may be a lithographic workflow.

Referring now to all the Figures, in one exemplary embodiment, a memory device includes a first electrical terminal and a second electrical terminal; a magnetic tunnel junction coupled to the second electrical terminal; wherein the magnetic tunnel junction comprises a magnetic free layer, and the magnetic tunnel junction is configured to be displaced by a plurality of distances from a center position of the memory device; a nonmagnetic metallic spin harvesting conductor coupled to the magnetic tunnel junction; wherein the nonmagnetic metallic spin harvesting conductor has a lateral dimension that is larger than that of the magnetic tunnel junction; an electrically insulating spin conductor coupled to the nonmagnetic metallic spin harvesting conductor; wherein the nonmagnetic metallic spin harvesting conductor collects spin current from the electrically insulating spin conductor; wherein the electrically insulating spin conductor has relatively less electrical conductivity than the nonmagnetic metallic spin harvesting conductor; and a spin orbit conduction channel coupled to the electrically insulating spin conductor and to the first electrical terminal; wherein the spin orbit conduction channel generates the spin current from a laterally asymmetric charge current flow; wherein the spin current is conducted by the electrically insulating spin conductor to the nonmagnetic metallic spin harvesting conductor and further delivered to the magnetic free layer of the magnetic tunnel junction.

The memory device may further include wherein the spin orbit conduction channel is connected to the electrically insulating spin conductor with an interface, the interface may be direct or may contain a minute doping material for promoting at least one of a material property, an electrical property, or a spin property. The memory device may further include wherein the electrically insulating spin conductor is connected to the nonmagnetic metallic spin harvesting conductor with an interface, the interface comprising a minute doping material for promoting at least one of a material property, an electrical property, or a spin property. The memory device may further include wherein the magnetic free layer permits the magnetic tunnel junction to be displaced by the plurality of distances from the center position of the memory device. The memory device may further include wherein the electrically insulating spin conductor redistributes a charge current from the magnetic tunnel junction to the spin orbit conduction channel to create the laterally asymmetric charge current flow, the laterally asymmetric charge current flow increasing in intensity towards the first electrical terminal. The memory device may further include wherein the electrically insulating spin conductor is configured such that its electrical conductance can be tuned so that a charge current flow entering vertically from the magnetic free layer into the electrically insulating spin conductor results in the laterally asymmetric charge current flow towards the first electrical terminal. The memory device may further include wherein a net amount of spin current coupled into the magnetic free layer by a combination of the nonmagnetic metallic spin harvesting conductor, the electrically insulating spin conductor, and the spin orbit conduction channel is augmented compared to having the magnetic free layer residing directly on the spin orbit conduction channel. The memory device may further include wherein the magnetic tunnel junction further comprises a tunnel barrier on the magnetic free layer, and a reference layer on the tunnel barrier, the reference layer being configured to couple the second electrical terminal to the magnetic tunnel junction.

In another exemplary embodiment, a memory device includes two terminals comprising a first electrical terminal and a second electrical terminal; a magnetic tunnel junction comprising a free layer coupled to the second electrical terminal; a spin and charge conductor whose lateral dimension is larger than that of the magnetic tunnel junction; an electrically insulating spin conductor coupled to the spin and charge conductor; wherein the spin and charge conductor collects spin current from the electrically insulating spin conductor; wherein the electrically insulating spin conductor has relatively less electrical conductivity than the spin and charge conductor; and a spin orbit channel coupled to the electrically insulating spin conductor and to the first electrical terminal; wherein the electrically insulating spin conductor assists the memory device with asymmetric charge current flow; wherein the asymmetric charge current flow is enhanced by the spin and charge conductor.

The memory device may further include wherein the spin orbit channel is connected to the electrically insulating spin conductor with an interface, the interface may be direct or may contain a minute doping material for promoting at least one of a material property, an electrical property, or a spin property. The memory device may further include wherein the electrically insulating spin conductor is configured such that its electrical conductance can be tuned so that a charge current flow entering vertically from the free layer into the electrically insulating spin conductor results in a laterally spread current, the laterally spread current being the asymmetric charge current flow in the spin orbit channel drawn away towards one side. The memory device may further include wherein a net amount of the spin current coupled into the free layer by a combination of the spin and charge conductor, the electrically insulating spin conductor, and the spin orbit channel is augmented compared to having the free layer residing directly on the spin orbit channel. The memory device may further include wherein the magnetic tunnel junction further comprises a tunnel barrier on the free layer, and a reference layer on the tunnel barrier, the reference layer being configured to couple the second electrical terminal to the magnetic tunnel junction. The memory device may further include wherein the magnetic tunnel junction is configured to be laterally displaced by a plurality of distances from a center position of the memory device closer to the first electrical terminal and downstream direction of the asymmetric charge current flow. The memory device may further include wherein the free layer permits the magnetic tunnel junction to be laterally displaced by the plurality of distances from the center position of the memory device.

In another exemplary embodiment, a method to form a memory device includes coupling a second electrical terminal to a magnetic tunnel junction; wherein the magnetic tunnel junction comprises a magnetic free layer, and the magnetic tunnel junction is configured to be displaced by a plurality of distances from a center position of the memory device; coupling a nonmagnetic metallic spin harvesting conductor to the magnetic tunnel junction; wherein the nonmagnetic metallic spin harvesting conductor has a lateral dimension that is larger than that of the magnetic tunnel junction; coupling an electrically insulating spin conductor to the nonmagnetic metallic spin harvesting conductor; wherein the nonmagnetic metallic spin harvesting conductor collects spin current from the electrically insulating spin conductor; wherein the electrically insulating spin conductor has relatively less electrical conductivity than the nonmagnetic metallic spin harvesting conductor; and coupling a spin orbit conduction channel to the electrically insulating spin conductor and to a first electrical terminal; wherein the spin orbit conduction channel generates the spin current from a laterally asymmetric charge current flow; wherein the spin current is conducted by the electrically insulating spin conductor to the nonmagnetic metallic spin harvesting conductor and further delivered to the magnetic free layer of the magnetic tunnel junction.

The method may further include connecting the spin orbit conduction channel to the electrically insulating spin conductor with an interface, the interface may be direct or may contain a minute doping material for promoting at least one of a material property, an electrical property, or a spin property. The method may further include wherein the electrically insulating spin conductor redistributes a charge current from the magnetic tunnel junction to the spin orbit conduction channel to create the laterally asymmetric charge current flow, the laterally asymmetric charge current flow increasing in intensity towards the first electrical terminal. The method may further include wherein the electrically insulating spin conductor is configured such that its electrical conductance can be tuned so that a charge current flow entering vertically from the magnetic free layer into the electrically insulating spin conductor results in the laterally asymmetric charge current flow towards one side. The method may further include wherein a net amount of spin current coupled into the magnetic free layer by a combination of the nonmagnetic metallic spin harvesting conductor, the electrically insulating spin conductor, and the spin orbit conduction channel is augmented compared to having the magnetic free layer residing directly on the spin orbit conduction channel.

LIST OF ABBREVIATIONS 3D three-dimensional
FL free layer
FM ferromagnetic
ISC insulating spin-conductor
MTJ magnetic tunnel junction
MR magnetoresistance
NM nonmagnetic metallic
n.u. no units
RL reference layer
sd spin diffusion
SOT spin orbit torque
STT spin transfer torque
TB tunnel barrier In the foregoing description, numerous specific details are set forth, such as particular structures, components, materials, dimensions, processing steps, and techniques, in order to provide a thorough understanding of the exemplary embodiments disclosed herein. However, it will be appreciated by one of ordinary skill of the art that the exemplary embodiments disclosed herein may be practiced without these specific details. Additionally, details of well-known structures or processing steps may have been omitted or may have not been described in order to avoid obscuring the presented embodiments. It will be understood that when an element as a layer, region, or substrate is referred to as being "on" or "over" another element, it can be directly on the other element or intervening elements may also be present. In contrast, when an element is referred to as being "directly on" or "directly" over another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

The description of the present invention has been presented for purposes of illustration and description, but is not intended to be exhaustive or limiting in the form disclosed. Many modifications and variations will be apparent to those of ordinary skill in the art without departing from the scope of the invention. The embodiments were chosen and described in order to best explain the principles of the invention and the practical applications, and to enable others of ordinary skill in the art to understand the invention for various embodiments with various modifications as are suited to the particular uses contemplated.

What is claimed is:
1. A memory device, comprising:
a first electrical terminal and a second electrical terminal;
a magnetic tunnel junction coupled to the second electrical terminal;
wherein the magnetic tunnel junction comprises a magnetic free layer, and the magnetic tunnel junction is configured to be displaced by a plurality of distances from a center position of the memory device;
a nonmagnetic metallic spin harvesting conductor coupled to the magnetic tunnel junction;

wherein the nonmagnetic metallic spin harvesting conductor has a lateral dimension that is larger than that of the magnetic tunnel junction;

an electrically insulating spin conductor coupled to the nonmagnetic metallic spin harvesting conductor;

wherein the nonmagnetic metallic spin harvesting conductor collects spin current from the electrically insulating spin conductor;

wherein the electrically insulating spin conductor has relatively less electrical conductivity than the nonmagnetic metallic spin harvesting conductor; and a spin orbit conduction channel coupled to the electrically insulating spin conductor and to the first electrical terminal;

wherein the spin orbit conduction channel generates the spin current from a laterally asymmetric charge current flow;

wherein the spin current is conducted by the electrically insulating spin conductor to the nonmagnetic metallic spin harvesting conductor and further delivered to the magnetic free layer of the magnetic tunnel junction.

2. The memory device of claim 1, wherein the spin orbit conduction channel is connected to the electrically insulating spin conductor with an interface, the interface may be direct or may contain a minute doping material for promoting at least one of a material property, an electrical property, or a spin property.

3. The memory device of claim 1, wherein the electrically insulating spin conductor is connected to the nonmagnetic metallic spin harvesting conductor with an interface, the interface comprising a minute doping material for promoting at least one of a material property, an electrical property, or a spin property.

4. The memory device of claim 1, wherein the magnetic free layer permits the magnetic tunnel junction to be displaced by the plurality of distances from the center position of the memory device.

5. The memory device of claim 1, wherein the electrically insulating spin conductor redistributes a charge current from the magnetic tunnel junction to the spin orbit conduction channel to create the laterally asymmetric charge current flow, the laterally asymmetric charge current flow increasing in intensity towards the first electrical terminal.

6. The memory device of claim 1, wherein the electrically insulating spin conductor is configured such that its electrical conductance can be tuned so that a charge current flow entering vertically from the magnetic free layer into the electrically insulating spin conductor results in the laterally asymmetric charge current flow towards the first electrical terminal.

7. The memory device of claim 1, wherein a net amount of spin current coupled into the magnetic free layer by a combination of the nonmagnetic metallic spin harvesting conductor, the electrically insulating spin conductor, and the spin orbit conduction channel is augmented compared to having the magnetic free layer residing directly on the spin orbit conduction channel.

8. The memory device of claim 1, wherein the magnetic tunnel junction further comprises a tunnel barrier on the magnetic free layer, and a reference layer on the tunnel barrier, the reference layer being configured to couple the second electrical terminal to the magnetic tunnel junction.

9. A memory device comprising:
two terminals comprising a first electrical terminal and a second electrical terminal;
a magnetic tunnel junction comprising a free layer coupled to the second electrical terminal;
a spin and charge conductor whose lateral dimension is larger than that of the magnetic tunnel junction;
an electrically insulating spin conductor coupled to the spin and charge conductor;
wherein the spin and charge conductor collects spin current from the electrically insulating spin conductor;
wherein the electrically insulating spin conductor has relatively less electrical conductivity than the spin and charge conductor; and
a spin orbit channel coupled to the electrically insulating spin conductor and to the first electrical terminal;
wherein the electrically insulating spin conductor assists the memory device with asymmetric charge current flow;
wherein the asymmetric charge current flow is enhanced by the spin and charge conductor.

10. The memory device of claim 9, wherein the spin orbit channel is connected to the electrically insulating spin conductor with an interface, the interface may be direct or may contain a minute doping material for promoting at least one of a material property, an electrical property, or a spin property.

11. The memory device of claim 9, wherein the electrically insulating spin conductor is configured such that its electrical conductance can be tuned so that a charge current flow entering vertically from the free layer into the electrically insulating spin conductor results in a laterally spread current, the laterally spread current being the asymmetric charge current flow in the spin orbit channel drawn away towards one side.

12. The memory device of claim 9, wherein a net amount of the spin current coupled into the free layer by a combination of the spin and charge conductor, the electrically insulating spin conductor, and the spin orbit channel is augmented compared to having the free layer residing directly on the spin orbit channel.

13. The memory device of claim 9, wherein the magnetic tunnel junction further comprises a tunnel barrier on the free layer, and a reference layer on the tunnel barrier, the reference layer being configured to couple the second electrical terminal to the magnetic tunnel junction.

14. The memory device of claim 9, wherein the magnetic tunnel junction is configured to be laterally displaced by a plurality of distances from a center position of the memory device closer to the first electrical terminal and downstream direction of the asymmetric charge current flow.

15. The memory device of claim 14, wherein the free layer permits the magnetic tunnel junction to be laterally displaced by the plurality of distances from the center position of the memory device.

16. A method to form a memory device comprising:
coupling a second electrical terminal to a magnetic tunnel junction;
wherein the magnetic tunnel junction comprises a magnetic free layer, and the magnetic tunnel junction is configured to be displaced by a plurality of distances from a center position of the memory device;
coupling a nonmagnetic metallic spin harvesting conductor to the magnetic tunnel junction;
wherein the nonmagnetic metallic spin harvesting conductor has a lateral dimension that is larger than that of the magnetic tunnel junction;
coupling an electrically insulating spin conductor to the nonmagnetic metallic spin harvesting conductor;
wherein the nonmagnetic metallic spin harvesting conductor collects spin current from the electrically insulating spin conductor;

wherein the electrically insulating spin conductor has relatively less electrical conductivity than the nonmagnetic metallic spin harvesting conductor; and coupling a spin orbit conduction channel to the electrically insulating spin conductor and to a first electrical terminal;

wherein the spin orbit conduction channel generates the spin current from a laterally asymmetric charge current flow;

wherein the spin current is conducted by the electrically insulating spin conductor to the nonmagnetic metallic spin harvesting conductor and further delivered to the magnetic free layer of the magnetic tunnel junction.

17. The method of claim 16, further comprising connecting the spin orbit conduction channel to the electrically insulating spin conductor with an interface, the interface may be direct or may contain a minute doping material for promoting at least one of a material property, an electrical property, or a spin property.

18. The method of claim 16, wherein the electrically insulating spin conductor redistributes a charge current from the magnetic tunnel junction to the spin orbit conduction channel to create the laterally asymmetric charge current flow, the laterally asymmetric charge current flow increasing in intensity towards the first electrical terminal.

19. The method of claim 16, wherein the electrically insulating spin conductor is configured such that its electrical conductance can be tuned so that a charge current flow entering vertically from the magnetic free layer into the electrically insulating spin conductor results in the laterally asymmetric charge current flow towards one side.

20. The method of claim 16, wherein a net amount of spin current coupled into the magnetic free layer by a combination of the nonmagnetic metallic spin harvesting conductor, the electrically insulating spin conductor, and the spin orbit conduction channel is augmented compared to having the magnetic free layer residing directly on the spin orbit conduction channel.

* * * * *